(12) United States Patent
Brabec et al.

(10) Patent No.: US 7,781,254 B2
(45) Date of Patent: Aug. 24, 2010

(54) NANOPOROUS FULLERENE LAYERS AND THEIR USE IN ORGANIC PHOTOVOLTAICS

(75) Inventors: Christoph Brabec, Linz (AT); Pavel Schilinsky, Nürnberg (DE); Christoph Waldauf, Innsbruck (AT)

(73) Assignee: Konarka Technologies, Inc., Lowell, MA (US)

( * ) Notice: Subject to any disclaimer, the term of this patent is extended or adjusted under 35 U.S.C. 154(b) by 322 days.

(21) Appl. No.: 11/184,462

(22) Filed: Jul. 19, 2005

(65) Prior Publication Data
US 2006/0025311 A1   Feb. 2, 2006

(30) Foreign Application Priority Data
Jul. 29, 2004   (DE) ............... 10 2004 036 793

(51) Int. Cl.
*H01L 21/00* (2006.01)
(52) U.S. Cl. ............ 438/99; 257/40; 257/E51.001
(58) Field of Classification Search .......... 257/40; 438/82, 99
See application file for complete search history.

(56) References Cited

U.S. PATENT DOCUMENTS

| | | | | |
|---|---|---|---|---|
| 5,986,206 | A * | 11/1999 | Kambe et al. | 136/263 |
| 6,559,375 | B1 * | 5/2003 | Meissner et al. | 136/263 |
| 6,683,244 | B2 * | 1/2004 | Fujimori et al. | 136/263 |
| 6,891,191 | B2 * | 5/2005 | Xiao et al. | 257/40 |
| 6,946,597 | B2 * | 9/2005 | Sager et al. | 136/263 |
| 7,045,205 | B1 * | 5/2006 | Sager | 428/304.4 |
| 2002/0093005 | A1 * | 7/2002 | Sohn et al. | 252/301.16 |
| 2003/0085397 | A1 * | 5/2003 | Geens et al. | 257/40 |
| 2004/0007969 | A1 * | 1/2004 | Lu et al. | 313/501 |
| 2004/0113903 | A1 * | 6/2004 | Mikami et al. | 345/204 |
| 2004/0131934 | A1 * | 7/2004 | Sugnaux et al. | 429/209 |
| 2004/0214041 | A1 * | 10/2004 | Lu et al. | 428/690 |
| 2005/0092359 | A1 * | 5/2005 | Uchida et al. | 136/256 |

(Continued)

FOREIGN PATENT DOCUMENTS

EP   1 691 428   8/2006

(Continued)

OTHER PUBLICATIONS

Jenekhe et al, "Efficient photovoltaic cells from semiconducting polymer heterojunctions," Applied Physics Letters, Oct. 23, 2000, vol. 77, No. 17, pp. 2635-2637.*

(Continued)

*Primary Examiner*—Kenneth A Parker
*Assistant Examiner*—Anthony Ho
(74) *Attorney, Agent, or Firm*—Fish & Richardson P.C.

(57) ABSTRACT

The present invention provides a process for forming a substrate for an organic semiconductor component. The process includes the steps of providing a fullerene network (10), providing a semiconductor solution (12), and applying the semiconductor solution (12) to the fullerene network (10), the viscosity of the semiconductor solution (12) being so adjusted that the semiconductor solution (12) infiltrates the pores of the fullerene network (10) and fills it so that the filled network forms a substrate (2). Further provided is a substrate comprising a fullerene network, composed of pure, unsubstituted fullerenes (10), and a semiconductor solution (12). Additionally provided is an organic semiconductor component, particularly an organic solar cell or an organic photodetector, that contains the inventive substrate.

24 Claims, 1 Drawing Sheet

U.S. PATENT DOCUMENTS

| | | | |
|---|---|---|---|
| 2005/0279399 A1 | 12/2005 | Gaudiana et al. | |
| 2006/0076050 A1* | 4/2006 | Williams et al. | 136/263 |
| 2006/0107996 A1* | 5/2006 | Shaheen et al. | 136/263 |
| 2007/0145324 A1 | 6/2007 | Masuda | |
| 2007/0215864 A1 | 9/2007 | Luebben et al. | |
| 2008/0315187 A1 | 12/2008 | Bazan et al. | |
| 2009/0032808 A1 | 2/2009 | Bazan et al. | |
| 2009/0108255 A1 | 4/2009 | Bazan et al. | |
| 2009/0194167 A1 | 8/2009 | Brabec | |

FOREIGN PATENT DOCUMENTS

| | | |
|---|---|---|
| EP | 1 447 860 | 8/2007 |
| EP | 1 816 491 | 8/2007 |
| WO | WO 01/86734 A1 * | 11/2001 |
| WO | WO 2004/063277 | 7/2004 |
| WO | WO 2004/105150 | 12/2004 |
| WO | WO 2006/123167 | 11/2006 |
| WO | WO 2007/076427 | 7/2007 |
| WO | WO 2008/066933 | 6/2008 |
| WO | WO 2009/058811 | 5/2009 |

OTHER PUBLICATIONS

Gao et al, "Efficient photodetectors and photovoltaic cells from composites of fullerenes and conjugated polymers: photoinduced electron transfer," International Conference on Science and Technology of Synthetic Metals (ICSM '96), Snowbird, UT, USA, Jul. 28-Aug. 2, 1996, vol. 84, No. 1-3, pp. 979-980.*

Rauch et al, "Performance of bulk-heterojunction organic photodetectors," 2004 4th IEEE Conference on Nanotechnology, pp. 632-634.*

Hoppe et al, "Nanoscale Morphology of Conjugated Polymer/Fullerene-Based Bulk-Heterojunction Solar Cells," Advanced Functional Materials, 2004, 14, No. 10, October, pp. 1005-1011.*

Hoppe et al, "Morphology of polymer/fullerene bulk heterojunction solar cells," Journal of Materials Chemistry, 2006, 16, 45-61.*

English Translation of WO 01/86734.*

Martens et al, "Disclosure of the nanostructure of MDMO-PPV:PCBM bulk hetero-junction organic solar cells by a combination of SPM and TEM," Synthetic Metals 138 (2003) 243-247.*

C.J. Brabec et al. "Plastic Solar Cells", Advanced Functional Materials, Feb. 2001, vol. 11, No. 1, pp. 15-26.

Chen et al., "Enhanced Efficiency of Plastic Photovoltaic Devices by Blending with Ionic Solid Electrolytes," Appl. Phys. Ltrs., 84(16):3181-3183, (2004).

Chirvase et al., "Influence of Nanomorphology on the Photovoltaic Action of Polymer-Fullerene Composites," Nanotechnology, 15:1317-1323, (2004).

Chirvase et al., "Temperature Dependent Characteristic of Poly(3Hexylthiophene)-Fullerene Based Heterojunction Organic Solar Cells," J. App. Phys., 93(6):3376-3383, (2003).

Coakley and McGehee, "Photovoltaic cells made from conjugated polymers infiltrated into mesoporous titania," Applied Physics Letters, 83(16):3380-3382, 2003.

Gunes et al., "Conjugated Polymer-Based Organic Solar Cells," Chem. Rev. 107(11):1324-1338, 2007.

Lee et al., "Processing Additives for Improved Efficiency from Bulk Heterojunction Solar Cells," J. Am. Chem. Soc., 130:3619-3623, (2008, e-pub. Feb. 21, 2008).

Li et al., "Investigation of Annealing Effects and Film Thickness Dependence of Polymer Solar Cells Based on Poly(3-Hexylthiophene)," J. Appl. Phys., 98(4):043704-1-043704-5, (2005).

Ma et al., "Thermally Stable, Efficinet Polymer Solar Cells with Nanoscale Control of the Interpenetrating Network Morphology," Adv. Funct. Mater., 15(10):1617-1622, (2005).

Nguyen et al, "Controlling Interchain Interactions in Conjugated Polymers: The Effects of Chain Morphology on Exciton—Exciton Annihilation and Aggregation in MEH-PPV Films," J. Phys. Chem. B, 104:237-255, (2000, e-pub. Dec. 17, 1999).

Peet et al., "Method for increasing the photoconductive response in conjugated polymer/fullerene composites," Applied Physics Letters, 89:252105, 2006.

Peet et al., "Efficiency enhancement in low-bandgap polymer solar cells by processing with alkane dithiols," Nature Materials, 6:497-500, 2007.

Peet et al., "Morphological Control of P3HT/PCBM Thin Films for Enhanced Polymer Solar Cell Performance," Poster, presented at 2005 International chemical Congress of Pacific Basin Societies, Honolulu, Hawaii, Dec. 15-20, 2005, one page.

International Preliminary Report on Patentability mailed on Jun. 11, 2009 for PCT Application No. PCT/US2007/024792, filed on Dec. 3, 2007.

International Search Report mailed on Mar. 4, 2009 for PCT Application No. PCT/US2008/081514, filed on Oct. 29, 2008.

International Search Report mailed on May 7, 2008 for PCT Application No. PCT/US2007/024792, filed on Dec. 3, 2007.

Written Opinion mailed on Mar. 4, 2009 for PCT Application No. PCT/US2008/081514, filed on Oct. 29, 2008.

Written Opinion mailed on May 5, 2008, for PCT Application No. PCT/US2007/024792, filed on Dec. 3, 2007.

* cited by examiner a) Provide fullerene network layer b) Apply polymer c) Polymer infiltrates Polymer has filled pores

NANOPOROUS FULLERENE LAYERS AND THEIR USE IN ORGANIC PHOTOVOLTAICS

CROSS-REFERENCE TO RELATED APPLICATION

This application claims priority under 35 U.S.C. 119 to German application number 102004036793.0, filed Jul. 29, 2004 and is incorporated by reference herein.

The present invention concerns organic semiconductor components, particularly organic solar cells and photodetectors. The present invention further concerns substrates suitable for the fabrication of organic semiconductor components.

Organic semiconductor devices offer numerous advantages over conventional—for example silicon-based-semiconductor components. No high-temperature or vacuum processes are needed for their fabrication, thus keeping production costs low. The raw materials are also usually very inexpensive. Organic components can be built on a thin, flexible carrier, so that the components produced are pliable. Their low cost makes them suitable for the mass production of electronic circuits for, among other things, disposable products. One example of the latter is the increasingly widespread use of radio-readable tags, so-called RFID chips, as a substitute for ordinary price tags or the like. However, organic semiconductors are also particularly well suited for high-quality products such as, for example, organic displays, e.g. mobile phone displays, or larger video screens in computer-related applications. Because of the materials used, the disposal of such organic circuits is also less environmentally critical than that of conventional circuits.

The use of solar cells continues to progress as well. Although organic solar cells have hitherto achieved lower efficiencies than conventional solar cells, they are nevertheless economically viable in many applications because of their much lower production cost. Further increases in efficiency are anticipated in the near future.

Organic solar cells contain semiconducting synthetic materials, so-called conjugated polymers, as their primary absorber material. Although these conjugated polymers exhibit high photosensitivity, the yield of free charge carriers after photoexcitation of the material is very low. Efficient charge separation can be achieved at present only by mixing the polymer phase with acceptor-type materials. One concept with regard to these solar cells is the use of composite absorbers, in which an unordered matrix of polymers is used for embedding the acceptor molecules. Since the interface between these two components is distributed throughout the absorber, this is referred to as a "bulk heterojunction."

Fullerenes, which are a modification of carbon (also known as "soccer-ball" molecules), can serve as acceptor-type materials. A number of fullerenes are known, including C60, C70, C76, C78 and C84.

Heretofore, the use of substituted fullerenes to fabricate solar cells according to the above-described concept was unavoidable, this being the only way to achieve good film quality and adequate phase morphology.

No processes have heretofore been known that permit the use of pure, unsubstituted fullerenes in organic photovoltaic components processed from solution. The object of the present invention is, therefore, to provide such a process, together with a substrate based on pure fullerenes.

The invention proposes an approach that enables C60 and other fullerenes to be used in organic solar cells and photodetectors, resulting in a sharp decrease in production cost and an increase in efficiency for solar cells. In this approach, fullerene networks composed of pure, unsubstituted fullerenes are filled with a semiconductor solution, thereby forming a substrate suitable for organic photovoltaic components.

According to one aspect of the invention, a process is provided for forming a substrate for an organic semiconductor component. The process includes the steps of providing a fullerene network, providing a semiconductor solution and applying the semiconductor solution to the fullerene network, the viscosity of the semiconductor solution being so adjusted that the semiconductor solution infiltrates the pores of the fullerene network and fills it so that the filled network forms a substrate. This process makes it possible to use pure, unsubstituted fullerenes, which are orders of magnitude cheaper than the conventionally used substituted fullerenes. Good film quality and adequate phase morphology can additionally be achieved by means of the inventive process.

It is preferred that the semiconductor solution be a p-type solution. There is a large selection of semiconductor solutions of this type that are suitable for the inventive process.

It is preferred that the semiconductor solution comprise conjugated polymer material. Such polymer material is inexpensive, easy to handle, and offers good properties for use in substrates of organic semiconductor components.

It is preferred that the semiconductor solution comprise nanoparticles. For example, solutions containing indium/tin oxide (ITO) nanoparticles and zinc oxide (ZnO) nanoparticles exhibit electron transfer with fullerenes and are therefore well suited for the semiconductor solution.

It is preferred that the fullerene network comprise carbon C60. C60 was the first fullerene to be discovered and is therefore the best known. It has substantially spherically shaped molecules ("soccer-ball molecules") and is therefore well suited for network formation.

It is preferred that the fullerene network comprise carbon C70. These molecules are, instead, oval-shaped. Using fullerenes of different geometry makes it possible to shape the structure of the fullerene network in a very flexible manner.

It is preferred that the fullerene network comprise higher fullerenes.

It is preferred that the fullerene network comprise at least regionally different fullerenes. This makes it possible to constitute regions with different properties in the substrate that is ultimately formed. These regions can be flexibly provided for semiconductor components that are subsequently processed on the substrate, in order to boost various properties of the component concerned.

It is preferred that the process further include the step of applying at least one additional layer to the substrate. Additional layers are used to control the operation or the properties of organic semiconductor components.

It is preferred that the at least one additional layer be a hole injection layer. The function and advantages of such a layer are well known from the prior art.

It is preferred that the at least one additional layer be an electron blocking layer. The foregoing statement applies here as well.

It is preferred that the organic semiconductor component be a solar cell. Solar cells constitute nonpolluting and independent power supplies that are used in many fields. Organic solar cells are very inexpensive to produce and are therefore more economical than conventional ones.

It is preferred that the organic semiconductor component be a photodetector. These are also very inexpensive to produce and are therefore preferred over conventional photodetectors.

According to a further aspect of the invention, a substrate is provided that comprises a fullerene network, composed of pure, unsubstituted fullerenes, and a semiconductor solution. Pure fullerenes are orders of magnitude cheaper than substituted fullerenes, so substrates of this kind are also much less expensive than conventional ones.

It is preferred that the semiconductor solution comprise conjugated polymer material. The advantages hereof have already been described in the foregoing.

It is preferred that the semiconductor solution comprise nanoparticles.

It is preferred that the fullerene network comprise carbon C60.

It is preferred that the fullerene network comprise carbon C70.

It is preferred that the fullerene network comprise higher fullerenes.

It is preferred that the fullerene network comprise at least regionally different fullerenes.

According to a further aspect of the present invention, an organic semiconductor component is provided. The semiconductor component comprises a substrate of the kind described hereinabove, and is in particular an organic solar cell or an organic photodetector. Such semiconductor components are thus very cheap to manufacture.

Fullerenes are produced in the gas phase. They used to be made in an electric arc, but it has recently become possible to produce them in a gas-phase reactor as well (see, for example, the Internet sites of the firms Nano-C and Mitsubishi & Frontier Carbon). With this reactor process, nanoparticulate layers of fullerenes can be deposited on electrodes (i.e., on the reactor wall or any desired substrates placed on the reactor wall). The morphology of these nanoparticulate layers can be shaped in a very flexible manner. Layers with particle sizes of a few nanometers to a few tens of nanometers can be deposited on a substrate. It should be noted that the invention is not, however, limited to the above-described gas phase process. In addition to the gas phase process, the scope of the invention likewise includes all other processes designed to produce fullerene networks and suitable for use in fabricating bulk heterojunction composite substrates, including so-called "sol-gel" or dispersion processes.

The invention is directed to the use of such nanoporous layers as substrates for organic solar cells. To obtain such a substrate, the fullerene layers, which have a network structure, are filled with a semiconductor solution, particularly a polymer solution. The polymer is applied to the surface, infiltrates the pores of the fullerene network and fills the pores. This results in a mixed layer analogous to bulk heterojunction layers composed of substituted fullerenes and polymers and applied entirely from solution.

Substrates produced in this manner offer comparable properties to those of conventional bulk heterojunction layers. They also, however, offer the advantage of a substantial cost savings, since pure fullerenes are orders of magnitude cheaper than substituted fullerenes. Organic solar cells or photodetectors having comparable properties can be fabricated with the substrate according to the inventive process at a fraction of the former production cost.

Figure 3:
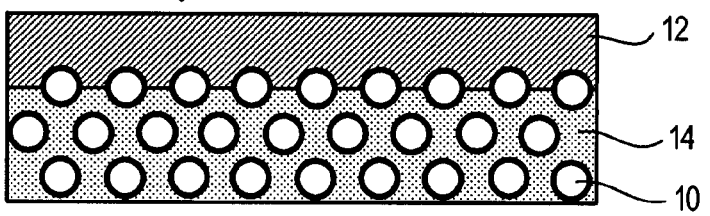
Figure 3:
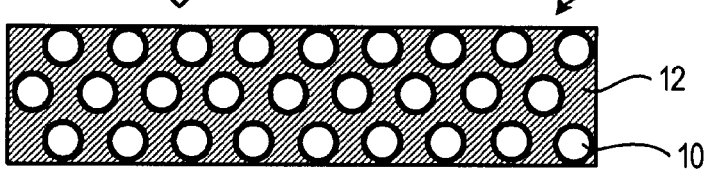
Figure 3:
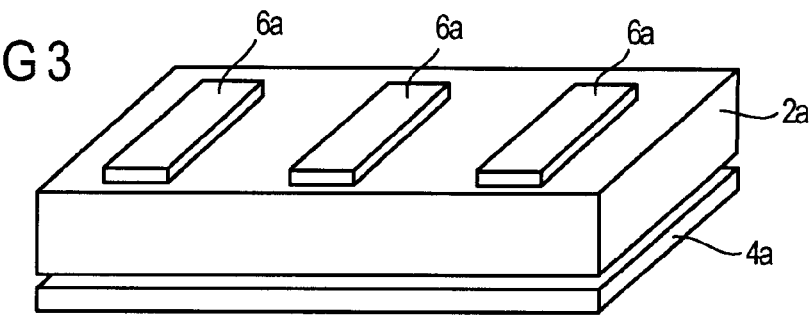

FIG. 3 illustrates a solar cell as described herein, which includes an absorber layer 2a that is contained between two electrodes in a sandwich geometry: an electrode 4a, and a back electrode 6a made of metal.

Figure 1:
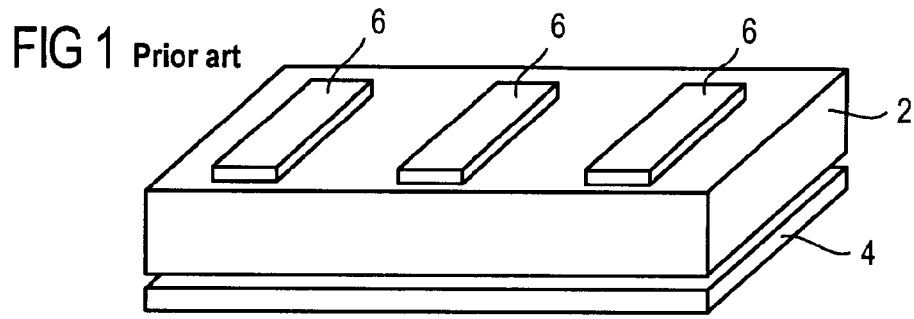
FIG. 1 shows the structure of a "bulk heterojunction" solar cell according to the prior art.

FIG. 1 illustrates the fundamental structure of a "bulk heterojunction" solar cell. The absorber layer 2 is contained between two electrodes in a sandwich geometry: an electrode 4, and a back electrode 6 made of metal.

Figure 2:
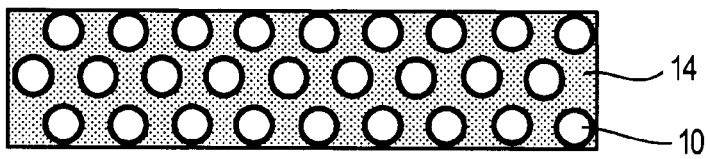
FIG. 2 shows the essential steps of the process according to the present invention.

FIG. 2 shows how a substrate for organic semiconductor components is formed according to the invention.

At a), the fullerene network is depicted in the form of a thin layer. The individual elements of the network 10, here shown in a simplified manner as spheres, are joined together in a network structure (not shown) and form between them interstices or pores 14 (dotted areas). The fullerene elements of the network can be selected, for example, from carbon C60, C70 or higher fullerenes. The various elements 10 can, but need not, be of the same kind. In one embodiment, the network can, for example, be constructed of carbon C60 fullerenes, in another embodiment of a combination of carbon C60 and C70, and in a further embodiment of higher fullerenes. Networks composed of only one type of fullerene are, therefore, just as feasible as those composed of a combination of two or more different fullerenes. It is equally feasible to provide internally homogeneous areas, each containing a different fullerene.

Drawing b) shows the status after a polymer solution 12 (hashed area) has been applied to the surface of the network. The pores 14 are not yet filled with polymer 12. The polymer layer can be applied by suitable known methods, for example inkjet printing or the like.

Drawing c) shows the status after the applied polymer 12 has infiltrated the pores 14 and filled them. The filled network forms a "bulk heterojunction" substrate 2, and this substrate 2 can now be used to make, for example, solar cells or photodetectors. Additional layers (not shown) can be applied during that operation, depending on the function of the component being fabricated.

It should be noted that the additional layers of a solar cell or photodetector according to the present invention can conform to the prior art. According to the prior art, various additional layers can be present, such as hole injection layers, electron blocking layers, and so on. Such layers are well known as a feature of the prior art and thus will not be discussed in more detail here.

Although this description refers essentially to solar cells, it should be noted that the present invention is also relevant to the fabrication of organic photodetectors and comparable components.

Alternatively to the semiconducting polymers, other p-type semiconductor layers can be used according to the present invention. The only prerequisites are that these layers be capable of filling the network and that they exhibit electron transfer with fullerenes (e.g. nanoparticles).

Regardless of circumstances, the consistency of the filling material must be engineered so that the filling material can infiltrate the network of a fullerene layer. The viscosity of the material must therefore be adapted to the fullerene network used as the base material, i.e. particularly with respect to pore size and pore structure. As noted above, these layers and the corresponding network structures can be adapted to requirements, and different variants of the modification of carbon known as "fullerene" can also be used (for example C60, C70 and higher fullerenes). The basic fullerene network can be made from carbon of only one kind (for example C60) or from any desired combination of known fullerenes. In addition, different regions can be provided in the fullerene network as the need requires, for example one region of C60 and another of C70.

Depending on how the filling material is engineered, especially in terms of viscosity, various techniques can be used to apply it to the fullerene network. Contactless methods are normally used for this purpose, so as not to harm the sensitive fullerene layers. Various printing or coating techniques, for example offset printing or so-called "curtain coating" (doctor blade coating) can be used, but other known methods are also suitable in principle and need not be described in greater detail.

The following embodiments, among others, can be realized with the inventive process described hereinabove.

A first inventive embodiment is an organic solar cell in which at least the absorber layer has a substrate comprising a nanoporous C60 fullerene network and a polymer solution, the substrate being producible by the inventive process.

A second inventive embodiment is an organic solar cell that has a substrate comprising a nanoporous C60/C70 fullerene network with a polymer solution. This substrate can be produced according to the process described hereinabove.

A third inventive embodiment is an organic solar cell that has a substrate comprising a nanoporous fullerene network composed of higher fullerenes with a polymer solution, this substrate also being producible according to the process described hereinabove.

The invention claimed is:

1. A process, comprising:
providing a first electrode;
providing a layer supported by the first electrode, the layer comprising a fullerene network having pores;
providing a semiconductor solution comprising a polymer; and
applying the semiconductor solution to the layer comprising the fullerene network, the viscosity of the semiconductor solution being so adjusted that the semiconductor solution infiltrates the pores of the fullerene network to provide a photoactive layer of an organic semiconductor component, the photoactive layer comprising the polymer and the fullerene, and the photoactive layer being supported by the first electrode.

2. The process according to claim 1, wherein the semiconductor solution is of the p type.

3. The process according to claim 1, wherein the semiconductor solution comprises conjugated polymer material.

4. The process according to claim 1, wherein the semiconductor solution comprises nanoparticles.

5. The process according to claim 1, wherein the fullerene network comprises carbon C60.

6. The process according to claim 1, wherein the fullerene network comprises carbon C70.

7. The process according to claim 1, wherein the fullerene network comprises higher fullerenes.

8. The process according to claim 1, wherein the fullerene network comprises at least regionally different fullerenes.

9. The process according to claim 1, further including applying at least one additional layer to the photoactive layer.

10. The process according to claim 9, wherein the at least one additional layer is a hole injection layer.

11. The process according to claim 9, wherein the at least one additional layer is an electron blocking layer.

12. The process according to claim 1, wherein the organic semiconductor component is a solar cell.

13. The process according to claim 1, wherein the organic semiconductor component is a photodetector.

14. The process of claim 1, wherein the semiconductor solution is devoid of fullerene before being applied to the layer.

15. The process of claim 1, wherein the layer comprising the fullerene network is formed by a sol gel process.

16. The process of claim 1, wherein the layer comprising the fullerene network is formed by a gas phase process.

17. The process of claim 1, wherein the layer comprising the fullerene network is formed in the absence of the semiconductor solution.

18. The process of claim 1, further comprising providing a second electrode, the layer being between the first and second electrodes.

19. The process of claim 1, wherein the fullerene and the polymer are not mixed before providing the comprising a fullerene network having pores.

20. A process, comprising:
providing a first electrode;
providing a fullerene network having pores supported by the first electrode; and
applying a semiconductor solution to the fullerene network having pores, the semiconductor solution comprising a polymer, the semiconductor solution having a viscosity so that the semiconductor solution is capable of infiltrating pores in the fullerene network to provide a photoactive layer comprising the polymer and the fullerene, and the photoactive layer being supported by the first electrode.

21. The process of claim 20, further comprising providing a second electrode, the photoactive layer being between the first and second electrodes.

22. The process of claim 21, wherein the process forms a photoactive device.

23. The process of claim 20, wherein the process forms a photoactive device.

24. The process of claim 20, wherein the fullerene and the polymer are not mixed before providing the fullerene network having pores.

* * * * *

UNITED STATES PATENT AND TRADEMARK OFFICE
CERTIFICATE OF CORRECTION

PATENT NO. : 7,781,254 B2
APPLICATION NO. : 11/184462
DATED : August 24, 2010
INVENTOR(S) : Christoph Josef Brabec It is certified that error appears in the above-identified patent and that said Letters Patent is hereby corrected as shown below:

Column 6,
Line 22, Delete "layer" and insert --photoactive layer--

Signed and Sealed this

Twenty-third Day of November, 2010

David J. Kappos
*Director of the United States Patent and Trademark Office*